United States Patent [19]
Waller, Jr.

[11] Patent Number: 4,647,876
[45] Date of Patent: Mar. 3, 1987

[54] EXTENDED RESPONSE DYNAMIC NOISE REDUCTION SYSTEM

[76] Inventor: James Waller, Jr., 9901 Allen Rd., Clarkston, Mich. 48016

[21] Appl. No.: 705,356

[22] Filed: Feb. 25, 1985

[51] Int. Cl.$^4$ .............................................. H04B 1/64
[52] U.S. Cl. ..................................... 333/14; 330/280; 381/106
[58] Field of Search .................. 333/14; 330/129, 138, 330/279, 280; 381/106; 455/72

[56] References Cited
U.S. PATENT DOCUMENTS

| | | | |
|---|---|---|---|
| 3,769,612 | 10/1973 | Yamazaki | 330/279 X |
| 4,182,993 | 1/1980 | Tyler | 330/279 |
| 4,398,158 | 8/1983 | Rodgers | 330/279 X |
| 4,538,297 | 8/1985 | Waller, Jr. | 333/14 X |

*Primary Examiner*—Paul Gensler
*Attorney, Agent, or Firm*—Frank John Catalano

[57] ABSTRACT

A noise reduction system compresses an input signal at a constant ratio in response to a control signal derived from the compressed signal. Added to the derived control signal is a counterfeit control signal which causes the compressor to mistrack when the compressed signal falls below a preselected threshold level. Thus, low level compressor output signals are increasingly deemphasized. A constant counterfeit control signal produces a logarithmic decrease in compressor output signal levels below the threshold point. The resulting compressed signal is used in two ways to enhance system noise reduction. First, the compressed signal is expanded at a constant ratio over all signal levels so that low level mistracked signals are further deemphasized and the system noise floor is lowered. Second, the expanded signal is fed to a filter having a variable bandwidth controlled by a signal derived from the compressed signal and responsive to compressed signal frequency and amplitude so that the filter is desensitized to input signal amplitude changes. A multistage filter control signal arrangement may be employed to provide variable cutoffs in more than one bandwidth.

26 Claims, 7 Drawing Figures

Fig. 6
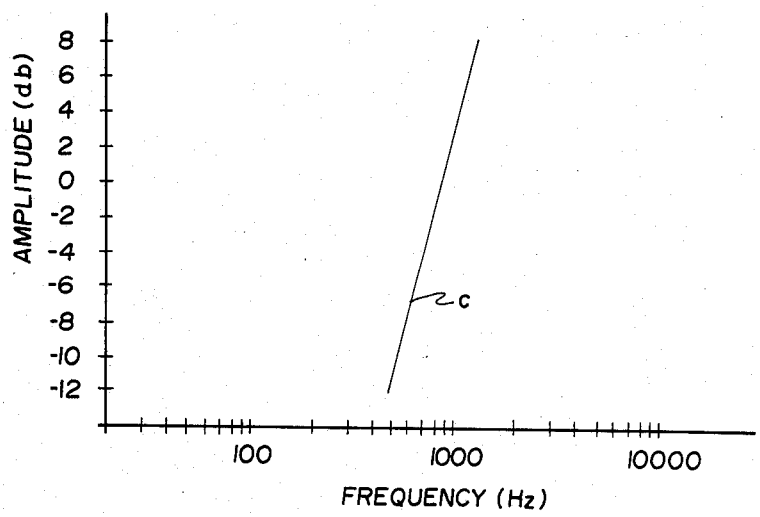
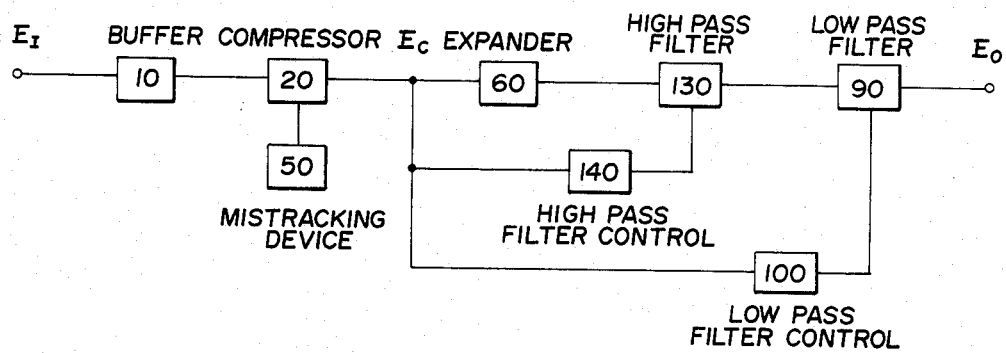
Fig. 7

EXTENDED RESPONSE DYNAMIC NOISE REDUCTION SYSTEM

BACKGROUND

This invention relates generally to non-complementary or single ended noise reduction systems and more particularly concerns non-complementary noise reduction systems incorporating dynamically controlled filtering and low level downward expansion.

Present audio technology is such that even modest systems are capable of accurate reproduction over the entire audio bandwidth. Consequently, background noise presents a problem in almost every audio application, including tape and disc recording and playback, radio and television broadcasting and electronic musical instrument and signal processing.

The relationship of dynamic range to noise reduction in both live and recorded material is of growing significance. Noise awareness is dramatically increased when little or no signal is present to mask the noise within a given portion of the audio spectrum. Dynamically controlled low pass and high pass filters have long been used to reduce noise in high and low segments of the audio spectrum. One such system presently in use applies only the principles of dynamically controlled low pass filtering and provides no reduction of noise in the low frequency portion of the audio spectrum. Others use both low and high pass filtering and thus narrow the bandwidth to mid-audio range frequencies, but this still permits noise to be carried through the system which would be audible in the absence of mid-frequency information.

Another known method of noise reduction is the use of low level expansion to reduce the overall level of the audio when the signal level drops below a predetermined point. Such systems provide no noise reduction at higher signal levels. Furthermore they are generally more responsive to low level transient surges, thus accentuating the pumping or breathing effect in these systems. Consequently, many of these systems employ elaborate circuitry to detect and compensate for the low level surges.

Systems do exist which utilize both dynamically controlled variable bandwidth low pass filtering and low level downward expansion. These existing systems, however, suffer from a wide range of problems or side effects. The range of response in the filter section is generally limited. That is, at low signal levels the amplitude of the signal is not sufficient to open the dynamic filter to pass all of the high frequency audio information, resulting in a severe loss of high frequency response. Furthermore, a 6dB per octave filter is generally used to limit the amount of attenuation in the high frequency spectrum, but when signal levels exceed the optimal operating level the dynamic filter is held open at all times. Thus, no noise reduction is obtained at high signal levels and at times a breathing effect is produced. Also in these systems, the downward expander is designed to produce no downward expansion when the signal is above a preselected threshold level. When the signal level drops below this point, expansion occurs. Consequently, percussive or other high transient material will modulate both the noise floor and the audio signal, causing pumping and breathing effects.

SUMMARY

In view of these limitations experienced with known systems, this invention provides a non-complementary noise reduction system which, among its objectives, affords an extended dynamic range in its dynamically controlled filter section allowing filter operation at both extremely low and extremely high signal levels and a higher level of attenuation on the order of 12 to 18 db per octave without a loss of frequency response. Additionally, the present invention provides an expander circuit with program dependent response to avoid pumping and breathing effects. A further objective of this invention is to provide a compression-expansion system which reduces the lower levels of mid-audio band frequency content to reduce noise in this frequency range and which disregards rather than compensates for low level transient surges. A correlated objective of the invention is to provide a system simultaneously responsive to both signal level and signal frequency in reducing noise over a maximized frequency range.

In accordance with the invention, an extended response dynamic noise reduction system is provided in which the dynamic range of the input signal is compressed to half its original range. The unity gain point of the compressor is selected so that the level of signals below the desired operating level of the system will be increased and the level of signals above the desired operating level of the system will be decreased prior to input to the dynamic filter control circuits. Thus, low level signals can appear high enough to the filter control circuits to be processed and high level signals can appear low enough to the filter control circuits to avoid holding the filters open with midfrequency signals. The compressor utilizes a threshold control preselecting the level at which low level signals are no longer fully compressed. That is, below this level, the compressor deviates from the 2 to 1 compression ratio. The compressed signal is fed to an expander circuit which performs the exact inverse function of the compressor circuit, except that the expander employs no threshold inverter and therefore always expands at a 1 to 2 ratio. Therefore, downward expansion begins at and increases substantially logarithmically below the preselected threshold level. Thus, the overall response of the compressor and expander is program dependent. Transient signals slightly exceeding the threshold level effect a slow response time while high signal levels cause a much faster response time, eliminating pumping and breathing effects in the expander. This method of downward expansion permits a floating or soft threshold level and downward expansion is virtually undetectable in operation.

BRIEF DESCRIPTION OF THE DRAWINGS

Other objects and advantages of the invention will become apparent upon reading the following detailed description and upon reference to the drawings in which:

FIG. 6 is an illustration of the impact of input signal frequency and amplitude variations on the amplitude of the control signal to the variably controlled filter of the embodiment of the present invention; and FIG. 7 is a block diagram of an embodiment of the present invention using dynamically controlled low pass and high pass filtering.

DETAILED DESCRIPTION

Figure 1:
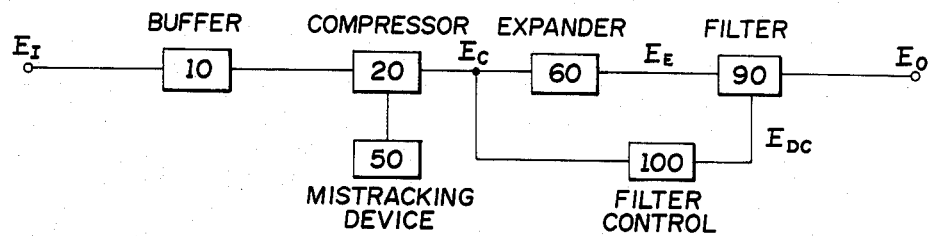
FIG. 1 is a block diagram of an embodiment of the present invention using only dynamically controlled low pass filtering.

The block diagram of the preferred dynamic noise reduction system is illustrated in FIG. 1. The system includes an input buffer 10 through which the input signal $E_I$ is fed to a compressor 20. The compressor 20 is adapted to compress the input signal $E_I$ at a constant 2 to 1 ratio. A mistracking device 50, however, causes the compressor 20 to compress the input signal $E_I$ at a variably decreasing ratio when the input signal $E_I$ falls below a preselected threshold level.

The compressed signal $E_C$ is fed to the expander 60 which is adapted to expand the compressed signal $E_C$ at a constant 1 to 2 ratio. No inverting device comparable to the mistracking device 50 is incorporated in the expander 60, so the portion of the compressed input signal $E_C$ below the preselected threshold level is downwardly expanded to a greater degree than it was compressed, thus reducing the noise floor of the system.

The expanded signal $E_E$ is then fed to a dynamically controlled low pass filter 90 which reduces its bandwidth in the absence of high frequency information. The low pas filter 90 is a voltage controlled filter, various types of which are currently available.

The dynamic control for the low pass filter 90 is derived from the compressed signal output $E_C$ of the compressor 20 by the filter control signal system 100. The system 100 is designed to provide an output D.C. control signal $E_{DC}$ which increases in response to increases in frequency or amplitude of the compressed signal $E_C$. Thus, the frequency band passed by the low pass filter 90 will expand in response to frequency and amplitude increases in the input signal $E_I$.

Figure 2:
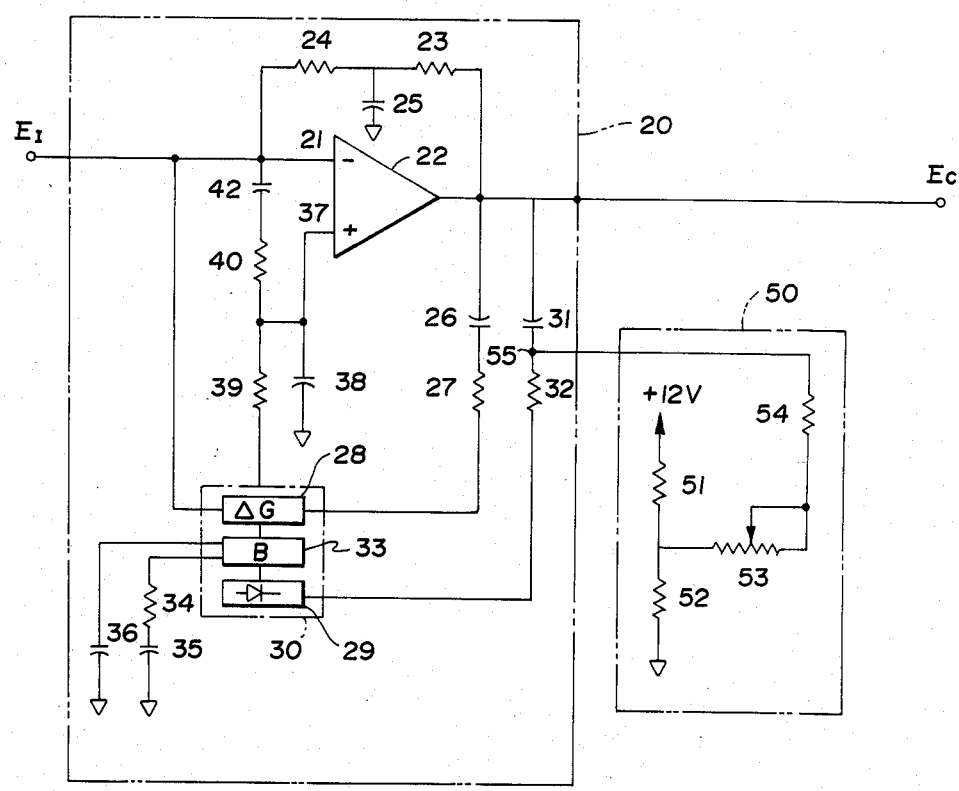
FIG. 2 is a schematic diagram of the compressor of the embodiment of the present invention including a threshold level downward expansion mistracking network.

Turning to FIG. 2, the circuitry and operation of the compressor 20 can be understood. The input signal $E_I$ fed from the buffer 10 is received at the inverting input 21 of the operational amplifier 22. The output of amplifier 22 is returned via a D.C. negative feedback loop to inverting input 21. The negative feedback loop includes series connected resistors 23 and 24 and a capacitor 25 connected between resistors 23 and 24 to ground. The capacitor 25 blocks low frequency A.C. feedback to the inverting input 21 of the amplifier 22. The output of the amplifier 22 is also fed via a capacitor 26, which serves as an A.C. coupler, to a resistor 27 which functions as a current limiter, and is connected to the input of a gain cell 28. The output of the gain cell 28 is returned to the inverting input 21 of the amplifier 22. Thus the gain cell 28 functions as an A.C. feedback loop to the amplifier 22.

In order to determine the gain of the amplifier 22, the gain cell 28 responds variably to an input D.C. signal derived by feeding the output signal of the amplifier 22 to a rectifier 29 via a series connected capacitor 31 and resistor 32. The capacitor 31 provides A.C. coupling and the resistor 32 is a current limiter. A buffer 33 is inserted in the D.C. control signal path between the rectifier 29 and the gain cell 28 to permit control or adjustment of attack and release time independently of one another. The attack time of the D.C. control signal is limited by a series connected resistor 34 and capacitor 35 and the release time by a capacitor 36.

The biasing input 37 to the amplifier 22 is connected to ground via a capacitor 38 to eliminate A.C. signals from the biasing input 37, and is also connected through a resistor 39 to the programmable analog device 30. In the preferred embodiment the device 30 is a currently available Dual Programmable Analog Compandor, Signetics Company Catalogue No. NE 572, having two discrete segments, each including a rectifier, buffer and gain cell. The biasing input 37 is also connected to the inverting input 21 of the amplifier 22 via a series connected resistor 40 and capacitor 42 to provide stability in the operational amplifier 22 below unity gain.

As described, the gain of the amplifier 22 of the compression network 20 is set to provide an output signal $E_C$ compressed at a 2 to 1 ratio constant across the entire range of input audio levels. But the system noise level will be reduced if signals below a preselected threshold level are less than fully compressed but are later fully expanded, thus reducing the level of the undesired signal. To accomplish this, a counterfeit D.C. signal is introduced into the rectifier input along with a A.C. coupled compressed signal. The mistracking device 50 consists of a voltage divider including resistors 51 and 52 series connected through a potentiometer 53 and a resistor 54 to the input circuit of the rectifier 29 at a connection point 55. The potentiometer 53 is adjusted so that a comparatively weak counterfeit D.C. signal combines with the A.C. compressed signal in the rectifier 29. Therefore, high levels of A.C. signal overwhelm the counterfeit D.C. signal and the effect of the counterfeit signal on the D.C. control signal is negligible. But at the predetermined lower levels of A.C. signal, the input of the counterfeit signal becomes significant, causing the compressor 20 to mistrack. Thus, the lower level signal is not compressed to the extent it would have been had the true D.C. control signal been transmitted to the gain cell 28. The resulting downward expansion is substantially, for practical purposes may be considered, logarithmic.

Figure 3:
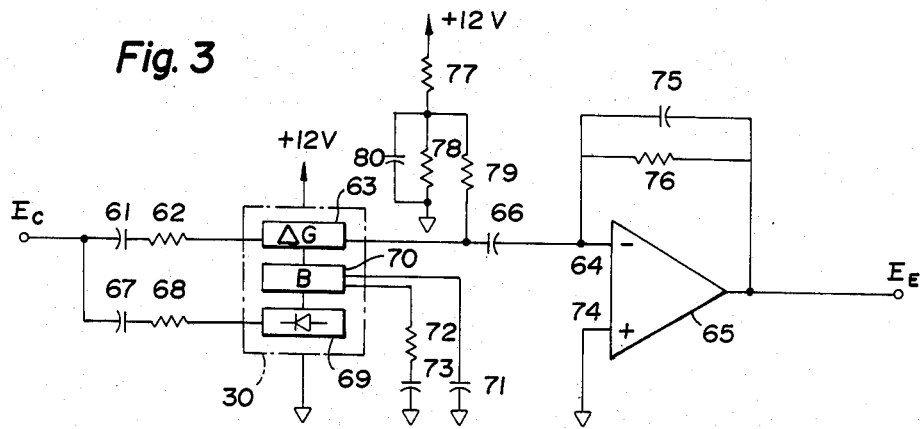
FIG. 3 is a schematic diagram of the expander of the embodiment of the present invention.

Turning now to FIG. 3, the operation of the expander 60 on the compressed signal $E_C$ can be seen. The signal $E_C$ is fed through a capacitor 61, which serves as an A.C. coupler, to a resistor 62 which functions as a current limiter and is connected to the input of the gain cell 63. The output of the gain cell 63 is fed to the inverting input 64 of the amplifier 65 via a capacitor 66. The gain of the amplifier 65 is determined by the variable response of the gain cell 63 to a D.C. control signal. The control signal is derived by feeding the compressed signal through a series connected capacitor 67, which is an A.C. coupler, and resistor 68, which is a current limiter, to a rectifier 69. The rectified signal is preconditioned by a buffer 70 inserted in the D.C. control signal path between the rectifier 69 and the gain cell 63. The release and attack times are limited by a capacitor 71 and a series connected resistor 72 and capacitor 73 respectively. It shall be noted that in the preferred embodiment, the gain cell 63, rectifier 69 and buffer 70 are the discrete counterpart of the gain cell 28, rectifier 30 and buffer 33 of the Dual Programmable Analog Compandor hereinbefore referred to. The attack and release times of the compressor 20 and the expander 60 are matched to provide an expander output signal $E_E$ identical to the compressor input signal $E_C$ at signal levels above the preselected threshold level.

The biasing input 74 of the amplifier 65 is connected to ground. A feedback loop consisting of a parallel connected capacitor 75 and resistor 76 connects the output of amplifier 65 to the inverting input 64 to set the gain of the amplifier 65.

A bias current to permit proper operation of the gain cell 63 is provided by use of a voltage divider consisting of resistors 77 and 78 connected to the output of the gain cell 63 through a current limiting resistor 79. A capacitor 80 is connected in parallel with the resistor 78 to insure that no A.C. signal will combine with the output of the gain cell 63.

It can easily be seen that the output signal $E_E$ of the expander 60 will have reduced noise characteristics at all frequencies for signal levels below the preselected threshold level. If the potentiometer 53 is adjusted so that the preselected threshold level is at or slightly below the nominal operating level of the system, much of the low level surge problem is eliminated and a high performance output is obtained. This performance can be further enhanced by controlling the bandwidth of the expanded output signal $E_E$ with a signal derived from the compressed signal $E_C$ which is desensitized to amplitude changes in the input signal $E_I$.

Figure 4:
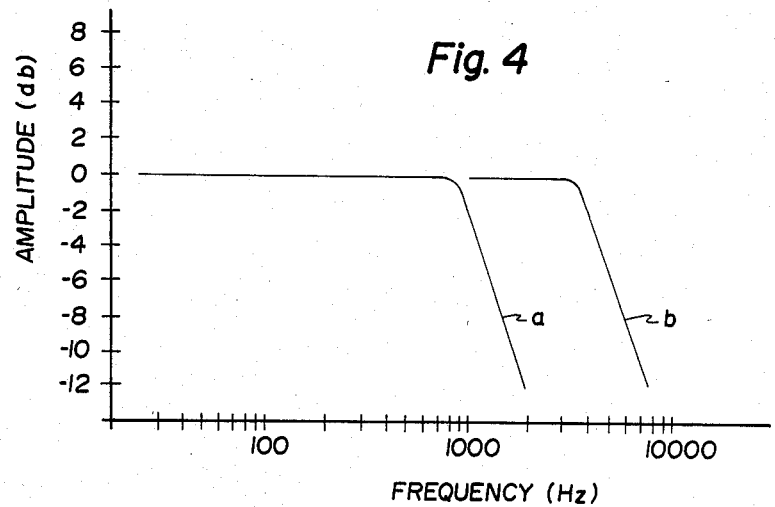
FIG. 4 is an illustration of the impact of control signal amplitude variations on the bandwidth of the output signal of the embodiment of the present invention.

The output of the expander 60 is fed to the low pass filter system 90 which, in the absence of high frequency information, reduces the bandwidth of the output signal, the amount of bandwidth reduction being a controllable variable. There are several known ways of achieving this variably controlled filtering effect, such as the use of operational transconductance amplifiers or multiplier circuits functioning essentially as variable resistors. As their resistance increases, the filter system cuts off more high frequency information. By use of a two stage system, a 12 db per octave attenuation slope can be obtained rather than the usual 6 db per octave slope. Curve a of FIG. 4 illustrates a filter turndown frequency of 1 kHz at a 12 db per octave slope. If more high frequency information were available, the filter turndown frequency would increase, as illustrated by curve b. The greater attenuation slope permits more noise attenuation in frequency ranges at which the ear is most sensitive.

Thus, it can be seen that, if the signal $E_{DC}$ controlling the voltage controlled filter is increased, the output bandwidth of the filter system 90 will be increased and, conversely, if the signal $E_{DC}$ controlling the filter is decreased, the output bandwidth will be decreased.

Furthermore, if this variation in control signal amplitude is made to be a function of variations in the signal frequency or amplitude of the input signal $E_I$, then bandwidth control will respond to changes in either or both of these criteria.

Figure 5:
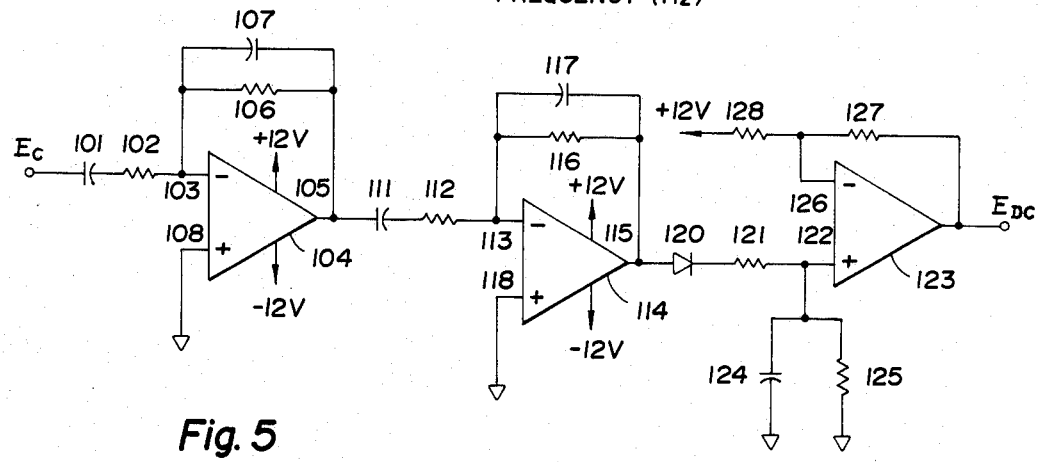
FIG. 5 is a schematic diagram of the low pass filter control signal system of the embodiment of the present invention.

To accomplish this, a low pass filter control signal system 100 as shown in FIG. 5 is provided. The output signal $E_C$ of the compressor 20 is A.C. coupled to the control signal system 100 by a capacitor 101 which is series connected to a resistor 102. The capacitor 101 and resistor 102 further serve to filter those low frequency signals which are to have no effect on the control of the low pass filter 90. That is, the 3 db point for filtering low frequencies out of the control signal is established. This filtered signal is fed to the inverting input 103 of an amplifier 104. The output 105 of the amplifier 104 is fed back via a resistor 106 to its inverting input 103 and a capacitor 107 connected in parallel with the resistor 106 provides operational amplifier stability. The amplifier 104 is referenced to ground at its biasing input 108. Some gain is provided due to the relationship of the resistors 102 and 106, and a 6 db per octave attenuation slope of low frequencies is established by this filter.

The output of this filter is fed through a similarly functioning filter consisting of an A.C. coupling capacitor 111 series connected through resistor 112 to the inverting input 113 of an amplifier 114. The amplifier output 115 is fed back via a resistor 116 to the inverting input 113 and a capacitor 117 is connected in parallel across the resistor 116. The biasing input 118 is referenced to ground. Further gain is provided by this amplifier and a 12 db per octave attenuation slope is now established by the two pole filter, as is shown in FIG. 6.

The output of the two filter stages is fed to a rectifier 120. The resulting rectified signal is fed through a resistor 121 to the input 122 of an amplifier 123. A capacitor 124 connects the input 122 to ground and, with resistor 121, sets the attack time of the voltage control filter 90. A resistor 125 also connects the input 122 to ground and, with capacitor 124, sets the release time of the voltage controlled filter 90. The grounding resistor 125 also serves as a D.C. bias to the amplifier input 122. The attack resistor 121 and release resistor 125 are chosen to permit rapid attack and slow release times. For lower levels of input signals to the rectifier 120, the capacitor 124 will discharge very slowly. Feedback to the inverting input 126 is provided via a resistor 127. The inverting input 126 is also connected via a resistor 128 to a 12 volt bias. The resulting output $E_{DC}$ of the D.C. control circuit 100 to which the voltage controlled filter 90 responds varies from approximately minus 8 volts to ground and increases as the level of frequency of the input signal $E_I$ increases.

In FIG. 6, the attenuation curve c of the control signal system is shown with an attenuation slope of 12 db per octave due to the two pole filter. It can easily be seen in reference to curve c that decreases in frequency or amplitude of the input signal $E_I$ result in attenuation of the output signal $E_{DC}$. Conversely, increases in frequency or amplitude of the input signal $E_I$ would result in increases in the level of the output control signal $E_{DC}$. Thus, the system is seen to be responsive to both the level and quantity of information contained in the applicable bandwidth.

Considering the embodiment of the system described in FIGS. 1 through 6 as a whole, the responsiveness of the system to variations in both input signal frequency and amplitude can be appreciated.

Since the compressor 20 and the expander 60 are responsive to variations in amplitude in the intput signal $E_I$, the downward expanded signal $E_E$ received by the low pass variably controlled filter 90 contains reduced levels of noise at all frequencies. The mistracking device 50 reduces the sensitivity of the compressor 20 to low level surges, thus reducing the pumping and breathing effects normally encountered in downward expansion systems. Furthermore, the variably controlled low pass filter 90 cuts off high frequency noise in response to the filter control network 100. Since the filter control network 100 itself includes a high pass filter system, low frequency surges in the input signal $E_I$ will not affect the variable high frequency cut off points. In addition, the combination of this compressor 20 expander 60 arrangement with the low pass filter 90 variably controlled by the filter control network 100 provides a result beyond the sum of the results of the components. Since the input signal to the control network 100 is actually the compressed output signal $E_C$ of the compressor 20, the sensitivity of the low pass filter 90 to changes in amplitude of the input signal $E_I$ above cut off low frequencies is reduced. Therefore, while the noise reduction benefits of downward expansion are obtained, the already reduced pumping or breathing effects normally encountered are further reduced.

It should also be noted, in reference to FIG. 7, that the principles of the above described embodiment can be conversely applied to provide a high pass filter 130 variably controlled by a filter control network 140 including its own low pass filtering system. Thus, high frequency surges in the input signal $E_I$ will not affect the variable low frequency cutoff point. And, of course, the sensitivity of the high pass filter 130 to changes in amplitude of the input signal $E_I$ is also reduced due to the use of the compressed signal.

It will be apparent to those skilled in the art that many alternatives may be chosen and modifications made in the invention herein described without departing from the scope of the invention. All matter contained in this description or shown in the drawings is illustrative and not a limitation of the scope of the invention. Accordingly, it is intended that the scope of this invention includes all such alternatives and modifications as are apparent from the description or drawings or the appended claims.

What is claimed is:

1. A noise reduction system for an input signal comprising:
   means for compressing said input signal;
   first means for sensing said compressed signal and for providing a D.C. signal responsive to said compressed signal to control compression at a consant ratio;
   means for adding a low level D.C. signal to said responsive D.C. signal to variably reduce the compression as the input signal decreases below a preselected threshold level;
   means for expanding said compressed signal; and
   second means for sensing said compressed signal and for providing a D.C. signal responsive to said compressed signal to control expansion at a constant ratio.

2. A system in accordance with claim 1 wherein said added low level D.C. signal is constant, whereby said reduction of compression is substantially logarithmic.

3. A system in accordance with claim 1 wherein said preselected threshold level is below the unity gain level of said compressing means.

4. A system in accordance with claim 1 wherein said constant expansion ratio is inversely proportionate to said constant compression ratio.

5. A system in accordance with claim 1 further comprising:
   means for filtering said expanded signal over a variably extended range of frequencies; and
   third means for sensing said compressed signal and for providing a D.C. signal responsive to levels and quantities of information in a preselected frequency band of said compressed signal to extend the bandwidth of said filtering means when said signal contains more than a predetermined level or quantity of information and to reduce the bandwidth of said filtering means when said signal contains less than a predetermined level or quantity of information.

6. A system in accordance with claim 5 wherein said filtering means is adapted to pass low frequency signals over a variably increasing bandwidth and said third sensing means is adapted to respond to levels and quantities of high frequency information.

7. A system in accordance with claim 5 wherein said filtering means is adapted to low pass filter said expanded signal and said third sensing means is adapted to high pass filter said compressed signal.

8. A system in accordance with claim 5 wherein said filtering means is adapted to pass low frequency signals over a first variably increasing bandwidth and to pass high frequency signals over a second variably increasing bandwidth and said third sensing means is adapted to respond to levels and quantities of high frequency information to control said first variably increasing bandwidth and to respond to levels and quantities of low frequency information to control said second variably increasing bandwidth.

9. A noise reduction system for an input signal comprising:
   means for compressing said input signal;
   first means for sensing said compressed signal and for providing a D.C. signal responsive to said compressed signal to control compression at a constant ratio;
   means for adding a constant low level D.C. signal to substantially logarithmically reduce the compression as the input signal level decreases below a preselected threshold level;
   second means for sensing said compressed signal and for providing a D.C. signal responsive to said compressed signal to control expansion at a constant ratio inversely proportionate to the constant ratio of said compressing means.

10. A system in accordance with claim 9 wherein said constant compression ratio is 2 to 1 and said constant expansion ratio is 1 to 2.

11. A system in accordance with claim 9 wherein said threshold level is below the unity gain level of said compressing means.

12. An extended response dynamically controlled noise reduction system for an input signal comprising:
   means for compressing said input signal;
   first means for sensing said compressed signal and for providing a D.C. signal responsive to said compressed signal to control compression at a constant ratio of 2 to 1;
   means for adding a constant low level D.C. signal to said responsive D.C. signal to substantially logarithmically reduce the compression as the input signal level decreases below a preselected threshold level;
   means for expanding said compressed signal;
   second means for sensing said compressed signal and for providing a D.C. signal responsive to said compressed signal to control expansion at a constant ratio of 1 to 2;
   means for low pass filtering said expanded signal over a variably extended range of frequencies; and
   third means for sensing said compressed signal, for high pass filtering said compressed signal and for providing a D.C. signal responsive to levels and quantities of high frequency information in said filtered compressed signal to extend the bandwidth of said low pass filtering means when said signal contains more than a predetermined level or quantity of high frequency information and to reduce the bandwidth of said low pass filtering means when said signal contains less than a predetermined level or quantity of high frequency information.

13. A system in accordance with claim 12 wherein said preselected threshold level is below the unity gain level of said compressing means.

14. A system in accordance with claim 12 further comprising:
means for high pass filtering said expanded signal over a variably extended range of frequencies; and
fourth means for sensing said compressed signal, for low pass filtering said compressed signal and for providing a D.C. signal responsive to levels and quantities of low frequency information in said filtered compressed signal to extend the bandwidth of said high pass filtering means when said signal contains more than a predetermined level or quantity of low frequency information and to reduce the bandwidth of said high pass filtering means when said signal contains less than a predetermined level or quantity of low frequency information.

15. An extended response dynamically controlled noise reduction system for an input signal comprising:
means for compressing said input signal;
first means for sensing said compressed signal and for providing a D.C. signal responsive to said compressed signal to control compression at a constant ratio of 2 to 1;
means for adding a constant low level D.C. signal to said responsive D.C. signal to substantially logarithmically reduce the compression as the input signal level decreases below a preselected threshold level below the unity gain level of said compressing means;
means for expanding said compressed signal;
second means for sensing said compressed signal and for providing a D.C. signal responsive to said compressed signal to control expansion at a constant ratio of 1 to 2;
means for low pass filtering said expanded signal over a variably increasing bandwidth;
third means for sensing said compressed signal, for high pass filtering said compressed signal and for providing a D.C. signal responsive to levels and quantities of high frequency information in said filtered compressed signal to extend the bandwidth of said low pass filtering means when said signal contains more than a predetermined level or quantity of high frequency information;
means for low pass filtering said expanded signal over a variably increasing bandwidth; and
fourth means for sensing said compressed signal, for low pass filtering said compressed signal and for providing a D.C. signal responsive to level and quantities of low frequency information in said filtered compressed signal to extend the bandwidth of said high pass filtering means when said signal contains more than a predetermined level or quantity of low frequency information and to reduce the bandwidth of said low pass filtering means when said signal contains less than a predetermined level or quantity of low frequency information.

16. A method of conditioning an input signal comprising the steps of:
compressing said input signal by a gain responsive to a composite D.C. control signal;
providing a first D.C. signal having a level varying in response to the amplitude of said compressed signal;
providing a constant D.C. signal having a level increasingly significant in relation to the level of said first D.C. signal as the amplitude of said compressed signal decreases below a preselected threshold level;
combining said first D.C. signal and said constant D.C. signal to form said composite D.C. control signal to maintain a constant ratio of compression when the amplitude of said compressed signal is above said preselected threshold level and to decrease the ratio of compression as the amplitude of said compressed signal decreases below said preselected threshold level;
providing a second D.C. signal having a level varying in response to the amplitude of said compressed signal; and
expanding said compressed signal by a gain responsive to said second D.C. signal to maintain a constant ratio of expansion whether the amplitude of said compressed signal is above or below said preselected threshold level.

17. A method according to claim 16 comprising the steps of:
providing a third D.C. signal having a level varying in response to the amplitude and frequency of said compressed signal; and
filtering said expanded signal over a preselected bandwidth variably extendable in response to increase in the level of said third D.C. signal.

18. A method according to claim 16 further comprising the steps of:
high pass filtering said compressed signal;
providing a third D.C. signal having a level varying in response to the amplitude and frequency of said high pass filtered signal; and
low pass filtering said expanded signal over a bandwidth variably extendable in response to increases in the level of said third D.C. signal.

19. A method according to claim 18 further comprising the steps of:
low pass filtering said compressed signal;
providing a fourth D.C. signal having a level varying in response to the amplitude and frequency of said low pass filtered signal; and
high pass filtering said expanded signal over a bandwidth variably extendable in response to increases in the level of said fourth D.C. signal.

20. A method of conditioning an input signal comprising the steps of:
compressing said input signal by a gain responsive to a composite D.C. control signal;
providing a first D.C. signal having a level varying in response to the amplitude of said compressed signal;
providing a constant D.C. signal having a level increasingly significant in relation to the level of said first D.C. signal as the amplitude of said compressed signal decreases below a preselected threshold level;
combining said first D.C. signal and said constant D.c. signal to form said composite D.C. control signal to compress said input signal at a rate of 2 to 1 when the amplitude of said compressed signal is above said preselected threshold level and to compress said input signal at a substantially logarithmically decreasing rate less than 2 to 1 as the amplitude of said compressed signal decreases below said preselected threshold level;

providing a second D.C. signal having a level varying in response to the amplitude of said compressed signal;

expanding said compressed signal by a gain responsive to said second D.C. signal to maintain a constant rate of expansion of 1 to 2;

providing a third D.C. signal having a level varying in response to the amplitude and frequency of said compressed signal; and filtering said expanded signal over a preselected bandwidth variably extendable in response to increase in the level of said third D.C. signal.

21. A method according to claim 20 wherein the step of providing a third D.C. signal includes the steps of:
high pass filtering said compressed signal; and
providing a third D.C. signal having a level varying in response to the amplitude and frequency of said high pass filtered signal.

22. A method according to claim 21 further comprising the steps of:
low pass filtering said compressed signal;
providing a fourth D.C. signal having a level varying in response to the amplitude and frequency of said low pass filtered signal; and
filtering said expanded signal over a second preselected bandwidth variably extendable in response to increases in the level of said fourth D.C. signal.

23. A noise reduction system for an input signal comprising:
means for compressing said input signal;
first means for sensing said compressed signal and for providing a D.C. signal responsive to said compressed signal to control compression at a constant ratio;
means for mistracking said compressing means to variably reduce the compression as the input signal decreases below a preselected threshold level;
means for expanding said compressed signal; and
second means for sensing said compressed signal and for providing a D.C. signal responsive to said compressed signal to control expansion at a constant ratio.

24. An extended response dynamically controlled noise reduction system for an input signal comprising:
means for compressing said input signal;
first means for sensing said compressed signal and for providing a D.C. signal responsive to said compressed signal to control compression at a constant ratio of 2 to 1;
means for mistracking said compressing means to variably reduce the compression as the input signal level decreases below a preselected threshold level;
means for expanding said compressed signal;
second means for sensing said compressed signal and for providing a D.C. signal responsive to said compressed signal to control expansion at a constant ratio of 1 to 2;
means for low pass filtering said expanded signal over a variably extended range of frequencies; and
third means for sensing said compressed signal, for high pass filtering said compressed signal and for providing a D.C. signal responsive to levels and quantities of high frequency information in said filtered compressed signal to extend the bandwidth of said low pass filtering means when said signal contains more than a predetermined level or quantity of high frequency information and to reduce the bandwidth of said low pass filtering means when said signal contains less than a predetermined level or quantity of high frequency information.

25. A method of conditioning an input signal comprising the steps of:
compressing said input signal by a gain responsive to a D.C. control signal;
providing a first D.C. signal having a level varying in response to the amplitude of said compressed signal to control compression at a constant ratio;
mistracking said compressed signal to decrease the ratio of compression as the amplitude of said compressed signal decreases below a preselected threshold level;
providing a second D.C. signal having a level varying in response to the amplitude of said compressed signal; and
expanding said compressed signal by a gain responsive to said second D.C. signal to maintain a constant ratio of expansion whether the amplitude of said compressed signal is above or below said preselected threshold level.

26. A method of conditioning an input signal comprising the steps of:
compressing said input signal by a gain responsive to a D.C. control signal;
providing a first D.C. signal having a level varying in response to the amplitude of said compressed signal to control compression at a constant ratio;
mistracking said compressed signal to decrease the ratio of compression as the amplitude of said compressed signal decreases below a preselected threshold level;
providing a second D.C. signal having a level varying in response to the amplitude of said compressed signal;
expanding said compressed signal by a gain responsive to said second D.C. signal to maintain a constant rate of expansion of 1 to 2;
providing a third D.C. signal having a level varying in response to the amplitude and frequency of said compressed signal; and
filtering said expanded signal over a preselected bandwidth variably extendable in response to increase in the level of said third D.C. signal.

* * * * *